United States Patent
Redha et al.

(10) Patent No.: US 12,210,076 B2
(45) Date of Patent: Jan. 28, 2025

(54) MATERIALS WITH HIGH DIELECTRIC CONSTANT FOR MAGNETIC RESONANCE IMAGING INSTRUMENTS

(71) Applicants: CENTRE NATIONAL DE LA RECHERCHE SCIENTIFIQUE (CNRS), Paris (FR); COMMISSARIAT A L'ENERGIE ATOMIQUE ET AUX ENERGIES ALTERNATIVES, Paris (FR); ECOLE CENTRALE DE MARSEILLE, Marseilles (FR); UNIVERSITE D'AIX-MARSEILLE (AMU), Marseilles (FR)

(72) Inventors: Abdeddaim Redha, Marseilles (FR); Anne-Lise Adenot-Engelvin, Luynes (FR); Marc Dubois, Marseilles (FR); Stefan Enoch, Marseilles (FR); Nicolas Mallejac, Tours (FR); Zo Raolison, Antony (FR); Pierre Sabouroux, Plan de Cuques (FR); Alexandre Vignaud, Paris (FR)

(73) Assignees: CENTRE NATIONAL DE LA RECHERCHE SCIENTIFIQUE (CNRS), Paris (FR); COMMISSARIAT A L'ENERGIE ATOMIQUE ET AUX ENERGIES ALTERNATIVES, Paris (FR); ECOLE CENTRALE DE MARSEILLE, Marseilles (FR); UNIVERSITE D'AIX-MARSEILLE (AMU), Marseilles (FR)

( * ) Notice: Subject to any disclaimer, the term of this patent is extended or adjusted under 35 U.S.C. 154(b) by 1085 days.

(21) Appl. No.: 17/043,712
(22) PCT Filed: Mar. 27, 2019
(86) PCT No.: PCT/EP2019/057800
§ 371 (c)(1),
(2) Date: Sep. 30, 2020
(87) PCT Pub. No.: WO2019/192914
PCT Pub. Date: Oct. 10, 2019

(65) Prior Publication Data
US 2021/0063511 A1    Mar. 4, 2021

(30) Foreign Application Priority Data
Apr. 3, 2018    (EP) .................................... 18165528

(51) Int. Cl.
*G01R 33/28* (2006.01)
*G01R 33/565* (2006.01)

(52) U.S. Cl.
CPC ....... *G01R 33/288* (2013.01); *G01R 33/5659* (2013.01)

(58) Field of Classification Search
CPC .......................... G01R 33/288; G01R 33/5659
See application file for complete search history.

(56) References Cited

U.S. PATENT DOCUMENTS

| | | | | |
|---|---|---|---|---|
| 10,649,044 B2* | 5/2020 | Jelezko | .............. | G01R 33/5601 |
| 2004/0002842 A1* | 1/2004 | Woessner | ............... | G16B 50/00 |
| | | | | 703/11 |

(Continued)

FOREIGN PATENT DOCUMENTS

| CN | 106380098 A | | 2/2017 |
|---|---|---|---|
| CN | 210301406 U | * | 4/2020 |

(Continued)

OTHER PUBLICATIONS

O'Reilly et al, (Int. Society for Magnetic Resonance in Medicine, vol. 24, No. 394, 2016). (Year: 2016).*

(Continued)

*Primary Examiner* — Liam J Heincer
*Assistant Examiner* — M. Reza Asdjodi
(74) *Attorney, Agent, or Firm* — Seckel IP, PLLC

(57) ABSTRACT

The invention relates to a material for use as a pad in high field and/or very high field magnetic resonance imaging instrument, comprising at least one polar solvent having a melting point of 14° C. to 50° C., a dispersant and a dielectric charge. The invention relates also to a pad used in (Continued)

field of high field and/or very high field magnetic resonance imaging made of at least such a material.

21 Claims, 2 Drawing Sheets

(56) References Cited

U.S. PATENT DOCUMENTS

| | | | | |
|---|---|---|---|---|
| 2004/0225213 | A1* | 11/2004 | Wang | H01F 10/324 600/421 |
| 2005/0194974 | A1 | 9/2005 | Feiweier et al. | |
| 2016/0072148 | A1 | 3/2016 | Lee et al. | |
| 2019/0221859 | A1 | 7/2019 | Le Mercier et al. | |
| 2019/0369175 | A1* | 12/2019 | Schwartz | B01J 27/20 |
| 2021/0063511 | A1* | 3/2021 | Redha | G01R 33/288 |
| 2021/0132172 | A1 | 5/2021 | Park | |

FOREIGN PATENT DOCUMENTS

| | | | | |
|---|---|---|---|---|
| CN | 210521195 | U | * 5/2020 | |
| CN | 113520365 | A | * 10/2021 | |
| JP | H04335648 | A | 11/1992 | |
| WO | WO-03040442 | A1 | * 5/2003 | B32B 27/32 |
| WO | WO-2005101046 | A1 | * 10/2005 | G01R 33/3415 |
| WO | 2017217596 | A1 | 12/2017 | |
| WO | 2018041709 | A1 | 3/2018 | |
| WO | 2018164502 | A1 | 9/2018 | |
| WO | WO-2019192914 | A1 | * 10/2019 | G01R 33/288 |

OTHER PUBLICATIONS

Liana (J. of Molecular Liquids, vol. 229, 2017, p. 217-220) (Year: 2017).*
Shin-Eui Park et al. Journal of Analytical Science and Technology (2023) 14:17 (Year: 2023).*
European Search Report and Written Opinion dated Oct. 15, 2018 in priority application No. EP18165528.3 (in English; total 10 pages).
International Search Report and Written Opinion dated Apr. 24, 2019 in corresponding application No. PCT/EP2019/057800; in English (total 14 pages).
Park et al., "Development of New Materials for the Reduction of the Magnetic Resonance Imaging Metal Artifacts and the Improvement of the Image Quality", Journal of Magnetics, vol. 22, No. 3, Sep. 30, 2017, pp. 508-513 (in English).
Gabrielyan et al., "Dielectric relaxation study of sulfolane-water mixtures", Journal of Molecular Liquids, vol. 229, Dec. 23, 2016, pp. 217-220 (in English).
Teeuwisse et al., "New barium titanate based dielectric materials for high field imaging", Proceedings of the International Society for Magnetic Resonance in Medicine, vol. 19, May 7, 2011, p. 622 (in English).
O'Reilly et al., "Practical improvements in the design of high permittivity pads for dielectric shimming in 7T neuroimaging", Proceedings of the International Society for Magnetic Resonance in Medicine, vol. 24, No. 394, Apr. 22, 2016 (total 3 pages) (in English).
European Office Action dated May 2, 2023 in corresponding application No. EP119712787.1 (in English; total 6 pages).

* cited by examiner

MATERIALS WITH HIGH DIELECTRIC CONSTANT FOR MAGNETIC RESONANCE IMAGING INSTRUMENTS

TECHNICAL FIELD OF THE INVENTION

The invention relates to materials to locally adjust the radiofrequency field generation in magnetic resonance imaging (MRI) instruments, pads comprising said materials, and methods for obtaining such materials.

BACKGROUND OF THE INVENTION

Magnetic resonance imaging is a method of obtaining images of the interiors of objects, especially living things such as humans and animals. It does not use ionizing radiation such as X-rays. Instead, it employs radio-frequency waves and intense magnetic fields to excite atoms in the object under evaluation. Patterns in this excitation are observed on a display. Magnetic resonance imaging can provide real-time, three-dial views of body organs, muscles, and joints without invasive surgery.

Magnetic resonance imaging with high field, such as a three Tesla field, and very high field of seven Tesla or more, theoretically allows to obtain images with spatial and/or temporal resolutions that are improved compared to those obtained at lower field. Thus, faster acquisition times and more accurate diagnostic analyzes will be expected in many areas and particularly in neurology. However, the increase of the magnetic field is accompanied by a decrease of the radiofrequency field wavelength, which remains true in the case of conventional emission transmitters of the "birdcage" type at the Larmor frequency. Depending on the organs and the field of the magnetic resonance imaging used, the regions to be observed have dimensions substantially similar to those of the radiofrequency wavelength, thus standing waves appear and result in signal blank areas.

In addition, the use of a high magnetic field also results in an increase in the associated energy deposition, measured by the Specific Absorption Rate (SAR) and which evolves as the square of the high magnetic field.

An existing solution is to insert dielectric pads into the measurement antenna in the vicinity of those areas to locally adjust the electromagnetic radiofrequency field the same way the pads are already used to remove images distortions generated by metal implants. The first pads were made of water as a solvent, which is the major constituent of the human body, to which was added particulate materials with a higher dielectric constant (dielectric load) than the solvent to improve their efficiency on the radiofrequency field redistribution. Other additives could be mixed in to make them thinner and to improve comfort.

It is known to assemble these pads into a corrective helmet. The pads are mainly based on water or deuterated water with or without dielectric charges component and/or additives. However, it does not clearly define the permittivity that such pads should have neither the number of pads the helmet is made of. The use of the pads reduces the power transmitted to the antenna by at least 50% compared to the standard mode of use and leads to a decrease in the SAR accompanied by an increase of the signal-to-noise ratio from 20% to 40%.

The dielectric charges component mainly used in the literature are spherical calcium or barium titanates which sizes are in most cases below 44 µm. However, the ideal permittivity range of pad use being between 150 and 300, these dielectric charges are loaded in quantities typically of about 40% in volume or more such that the water-charge composition is no longer homogeneous, because of porosity and agglomerates. They are no longer wet and, at these very high concentrations, heterogeneities appear. This limitation is generally overcome by incorporating a dispersant in the composition. However, the dielectric charges demix from, the solvent after a few weeks due to their high concentration.

As a consequence, a significant risk of sedimentation exists that can completely transform the behavior of the pad until it renders it ineffective or risky for the patient because of the uncontrolled redistribution of the field, resulting in specific SAR problems. In order to reduce it, additives such as Agar or Xanthan gums can be added in the composition but significantly deteriorate the mechanical properties of the pads.

Thus, these pads generally have a short life span due to water evaporation and particles sedimentation. In addition, the manipulations that result from their regular use increase the risk of sedimentation of the material and therefore heterogeneities that imaged the performance of the pad. Moreover, depending on the dielectric charges considered, the ideal ranges are reached for quantities of dielectric charges saturating the water solvent.

In summary, the use of pads currently proposed in the literature is limited by its instability and short lifespan.

Accordingly, a need exists for improved materials and pads comprising said materials considering the state of the art.

SUMMARY OF THE INVENTION

In accordance with a first aspect, the invention relates to a material for use in a pad for high field and/or very high field magnetic resonance imaging instruments, characterized in that said material comprises at least one polar solvent having a melting point of 14° C. to 50° C., a dispersant and a dielectric charged component.

Advantageously, the material according to the invention features at least one of the following characteristics:
the polar solvent is selected from fluoro-ethylene carbonate, diethyl-cyano-ethyl phosphonate, ethyl-1-methyl-sulfone, tetramethylene sulfone and isopropyl-methyl-sulfone, or a combination thereof;
the dispersant is chosen from gums such as xanthan gum or phytagels, agaroses, gelatins, glycerols, celluloses, polyacrylamides, polysaccharides, polyacrylic polymers and polyethylene glycols, or a combination thereof;
the dielectric charge component is selected from SiC, $BaTiO_3$ or $CaTiO_3$ or a combination thereof;
the dielectric charge component is in the form of particles having, average sizes ranging from 0.1 µm to 50 µm;
the dielectric charge component is in the form of particles having average sizes ranging from 0.5 µm to 50 µm;
the dielectric charge component is in the form of particles having average sizes ranging from 7 µm to 8 µm;
the proportion of polar solvent is comprised between 1% and 95% in volume, the proportion of dispersant is up to 40% in volume. The proportion of dielectric material is between 5% and 99%;
the proportion of polar solvent is preferably comprised between 10% and 85% in volume. The proportion of dispersant is up to 40% in volume. The proportion of dielectric material is between 15% and 90%;
the material comprises up to 40% in volume of dispersant;
the proportion of dispersant is comprised between 0.5% and 9% in volume. The proportion of solvent is between 10% and 85%. The proportion of dielectric material is between 10% and 85%;

the proportion of the dielectric charge component is comprised between 4% and 90% in volume. The proportion of dispersant is up to 40%. The proportion of solvent is between 10% and 96%;

the proportion of dielectric charge component is comprised between 10% and 85% in volume. The proportion of dispersant is up to 40%. The proportion of solvent is between 15% and 90%;

According to a second aspect, the invention relates to a pad used in field of high field and/or very high field magnetic resonance imaging comprising the material as defined above.

According to a third aspect, the invention also relates to a method for obtaining the material as defined above, comprising the steps of:

mixing the solvent manually and/or mechanically from 100 rpm to 500 rpm, for periods ranging from 1 to 5 minutes at temperatures ranging from 25° C. to 300° C., adding gradually up to 40% in volume of the dispersant;

stirring mechanically and/or manually the composition obtained in the preceding step for periods ranging from 1 minute to 300 minutes at temperatures ranging from 25° C. to 300° C.;

adding gradually from 4% to 90% in volume of the dielectric charge component; and stirring mechanically and/or manually the mixture obtained in the preceding step for a period of time of 1 minute to 300 minutes at temperatures comprised between 25° C. and 300° C.

BRIEF DESCRIPTION OF THE DRAWINGS

The foregoing and other new features and advantages of the present invention will become more apparent and more readily appreciated by those skilled in the art after consideration of the following description in conjunction with the associated drawings, of which.

DETAILED DESCRIPTION OF THE INVENTION

Figure 1:
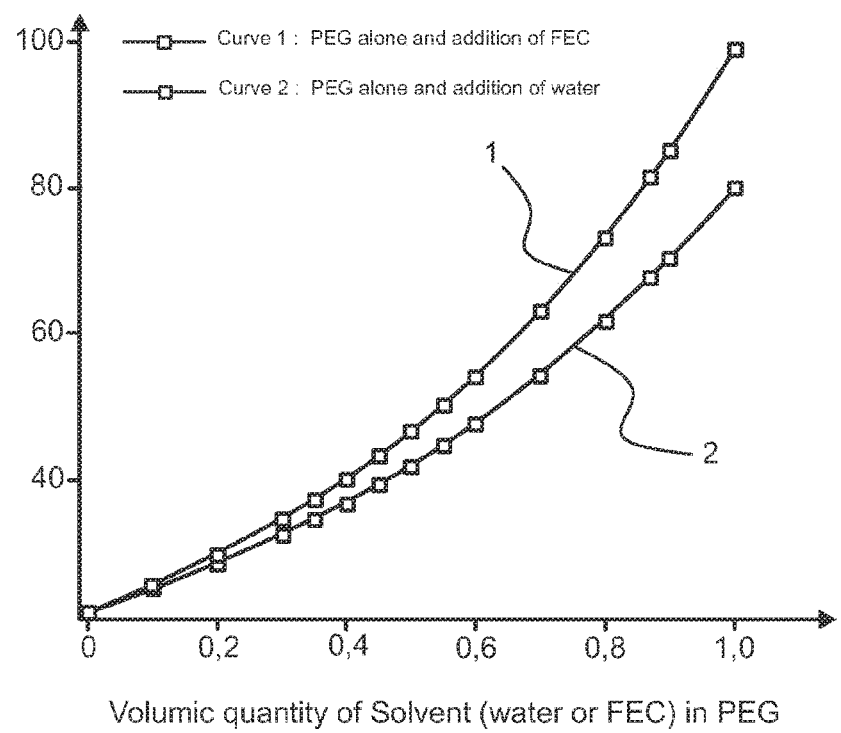
FIG. 1 represents the simulation of permittivity at 300 MHz of a material in relation to the volumetric quantity of solvent (water or fluoroethylene carbonate) in polyethylene glycol.

According to the present invention, the terms "ranging from . . . and . . . " and the terms "between . . . and . . . " used in proportion intervals have to be understood as integrating the lower and upper limit of such intervals. The terms "% in volume" have to be understood as "% in volume based on the total volume of the material", i.e. the material composition.

The invention relates, in a first aspect, to a material for use in a pad for high field and/or very high field magnetic resonance imaging. High field magnetic resonance imaging is carried out, for example, at 3 Tesla. Very high field magnetic resonance imaging is carried out, for example, at 7 Tesla. The material according to the invention comprises at least one polar solvent having a melting point ranging from 14° C. and 50° C., a dispersant and a dielectric charge.

According to a preferred embodiment, the polar solvent is selected from the group consisting of fluoro-ethylene carbonate (FEC), diethyl-cyano-ethyl phosphonate, ethyl-1-methyl-sulfone, tetramethylene sulfone and isopropyl-methyl-sulfone, or a combination thereof. A preferred polar solvent is fluoro-ethylene carbonate. The proportion of polar solvent is comprised between 1% and 95%, preferentially between 10% and 85%, more preferentially between 14% and 53% in volume.

The dispersant, according to a specific embodiment of the invention is selected from the group consisting of gums such as xanthan or phytagel, agaroses, gelatins, glycerols, celluloses, polysaccharides, polyacrylic polymers, polyethylene glycols and polyacrylamides, or a combination thereof. The material according to the invention comprises up to 40% in volume of dispersant. Practically, the proportion of dispersant is comprised between 0.5% and 9%, preferably between 1% and 9%, more preferably comprised between 1% and 5.9% in volume.

Advantageously, the polar solvent has a high dielectric constant, i.e. superior of that of water and a melting temperature of about 20 to 25° C. The dispersant, soluble in this solvent, has a melting point of about 20 to 25° C. Together, they form a viscous matrix in which dielectric charged component of electrical permittivity, higher than the electrical permittivity of solvent, are dispersed.

The dielectric charge or dielectric charge component, which is in a particulate form, also called filler, is a material having a permittivity higher than the electrical permittivity of the solvent. For example, the filler is selected from the group consisting of SiC, $BaTiO_3$ and $CaTiO_3$. The dielectric charge component is in particular in the form of particles, which are spherical or substantially spherical, and which have average sizes ranging from 0.1 µm to 50 µm, preferably ranging from 0.5 µm to 50 µm, more preferably ranging from 7 to 8 µm. In fact, the particles themselves have sizes ranging from 0.1 µm to 50 µm, preferably ranging from 0.5 µm to 50 µm, more preferably ranging from 7 to 8 µm. The filler, dispersed in the matrix, provides the dielectric properties of the composition. Particles properties can be adjusted to exhibit enhanced EM properties. For example, the particles may have received surface treatment in order to adjust their affinity to the matrix or have a particular shape to exhibits anisotropic EM properties. The proportion of dielectric charge is comprised between 4% and 90% preferably between 10% to 85% and more preferably between 41% to 85% in volume.

As a result, the composition of the present invention comprises a solvent, a dispersant and a dielectric filler. Wherein said solvent is a liquid having a melting temperature comprised between 14° C. and 50° C. and a permittivity ranging from 40 to 100. A non-exhaustive list of suitable solvents is presented in table 1. below with their respective permittivities at 300 MHz.

TABLE 1

| Solvent Name | Melting Temperature (° C.) | Permittivity at 300 MHz |
| --- | --- | --- |
| Fluoro-ethylene-carbonate | 40 | 99 |
| Diethyl-cyano-ethyl-phosphonate | 23 | 50 |
| Ethyl-methyl-sulfone | 34 | 95 |

TABLE 1-continued

| Solvent Name | Melting Temperature (° C.) | Permittivity at 300 MHz |
|---|---|---|
| Tetra-methylene-sulfone | 25 | 60 |
| Isopropyl-methyl-sulfone | 25 | 48 |

Embodiments according to the invention include all combinations of a different solvent having a melting temperature between 14° C. and 50° C. or derivative of fluoroethylene carbonate or polyethylene glycol derivative having a melting temperature of between 10° C. and 50° C.

The dispersant is an additive which aims to give more viscosity to the mixture while facilitating the dispersion of the filler in the matrix. A non-exhaustive list of potential dispersants is given in the table 2 below. The function of the chosen compound will be made according to the desired properties while its length of chains will be made according to the desired viscosity and saturation level of the charge in the solvent.

TABLE 2

| Polyacrylamides | Polysaccharides |
|---|---|
| Agaroses | Gelatins |
| Glycerols | Polyacrylic polymers |
| Polyethylene glycols | Celluloses |

The invention relates, according to a second aspect, to a method for obtaining a material as above-defined. The method comprising the following steps.

mixing the solvent manually and/or mechanically, for example with a blade or magnetic stirred rotating from 100 rpm to 500 rpm, for periods ranging from 1 to 5 minutes at temperatures ranging from 25° C. to 300° C. A mechanical stirring at 300 rpm for about 5 min at about 75° C. is preferred.

adding gradually the dispersant wherein the amount of dispersant is ranging from 0.5% to 9% by volume. A volume of dispersant gradually added to the solvent stirred at 300 rpm at 75° C. is preferred.

stirring mechanically and/or manually the mixture obtained in the preceding step for periods ranging from 1 minute to 300 minutes at temperatures ranging from 25° C. to 300° C. A mechanical stirring for 5 min at 75° C. is preferred.

adding gradually the dielectric charge component wherein the amount of dielectric charge component is ranging from 4% to 90% by volume.

stirring mechanically and/or manually the composition obtained in the preceding step for a period of time ranging from 1 minute to 300 minutes at temperatures ranging from 25° C. to 300° C. A temperature range of 25 to 200° C. is preferred.

The ordinary skill in the art is able to adapt the stirring period in function of the material amount prepared.

For an amount of dielectric charge component comprised between 40% and 50% in volume, stirring manually for 5 to 15 min. at 25° C. is preferred. For an amount of 50% in volume and above, stirring manually 30 sec. every 30 min. at 200° C. for 1 h 30 is preferred.

According to a preferred embodiment, the method comprises a step of preparing at 80° C. a matrix consisting of 14% to 81% by volume of FEC amounts from 1% to 9% by volume of PEG. The matrix is mechanically mixed for 1 to 30 minutes depending on the amount prepared. Advantageously, the dielectric charge component is in the form of particles of SiC having an average diameter of 0.5 to 7 µm. Said dielectric charge component is added into the matrix at 200° C., in an amount of 10 to 85% in volume, to obtain the composition. Said composition is homogenized with a blade or magnetic stirred as an example and/or by manual mixing for a period of time of 5 minutes or more and preferably from 5 minutes to 150 minutes at 200° C.

According to a preferred embodiment, the composition consists of 10 to 40% in volume of SiC particles, 54 to 81% of solvent and 6 to 9% of dispersant.

According to a second embodiment, the composition consists of 41 to 55% in volume of SiC particles, 41 to 53% of solvent and 4.5 to 6% of dispersant.

According to a third embodiment, the composition consists of 56 to 85% in volume of SiC particles, 14 to 40% of solvent and 1.3 to 4.4% of dispersant.

EXAMPLES

Example 1: Simulation of Permittivity at 300 MHz Related to the Volume Solvent Amount in Polyethylene Glycol (PEG)

Polyethylene glycol (PEG) has been mixed with fluoroethylene carbonate (FEC) to demonstrate the permittivity evolution of this mixture compared to the permittivity evolution of the mixture containing polyethylene glycol and water (see FIG. 1).

As it is shown in FIG. 1, the permittivity of the mixtures increases with the volumetric amount of solvent. Moreover, the mixture with FEC displays better permittivity than the mixture containing water thus allowing to add more dispersant at a given permittivity level.

Figure 2:
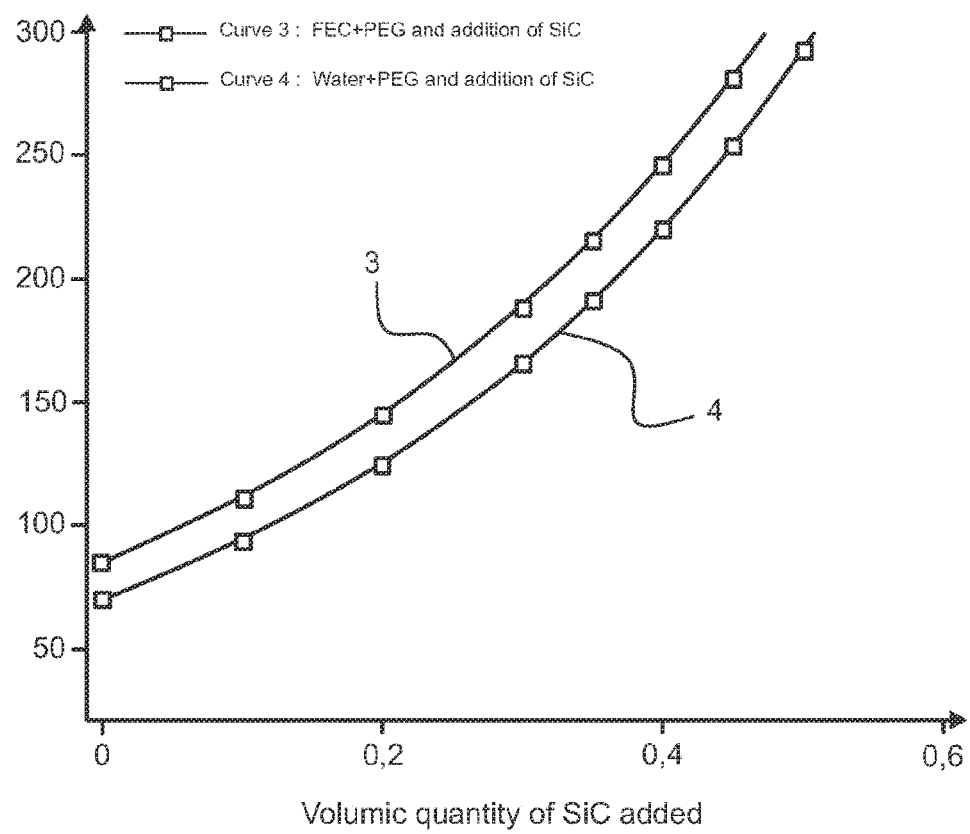
FIG. 2 represents the simulation of permittivity at 300 MHz of a material in relation to volumetric quantity of the dielectric charge component (SiC).

Example 2: Simulation of Permittivity at 300 MHz Related to the Volumetric Amount of Filler As it is shown in FIG. 2, a mixture of EEC, PEG and SiC demonstrated better permittivity at 300 MHz, compared to the mixture of water, PEG and SiC.

This association of solvent having a melting point between 14° C. and 50° C., a dispersant and a dielectric charge aims in particular to prevent the sedimentation of particles, to easily control the viscosity of the matrix, to limit the risks of heterogeneity, and to limit the evaporation of the solvent, in order to obtain a pad as efficient as those based on barium titanate but more comfortable, with a longer lifespan and lower toxicity.

Example 3: Required Quantities to Prepare 100 g of the Composite Material

The table 3 below features the quantities in g of the solvent (fluoroethylene carbonate—FEC) and dispersant (Polyethylene glycol—PEG) to be mixed for producing 100 g of solvent with dispersant:

TABLE 3

|  | % in volume | Weights (g) |
|---|---|---|
| FEC | 10 to 99.5 | 13 to 99.6 |
| PEG | 0.5 to 90 | 0.4 to 87 |

The table 4 below features the quantities in g of silicon carbide powder to be mixed with the solvent with dispersant for the production of 100 g of composite:

TABLE 4

|  | % in volume | Weights (g) |
|---|---|---|
| Solvent with dispersant | 10 to 95.5 | 4.5 to 87.7 |
| SiC | 4.5 to 90 | 12.3 to 95.5 |

The table 5 below features the quantities in g of silicon carbide powder, fluoroethylene carbonate and Polyethylene glycol to mix for the realization of 169 g of composite in the ideal case:

TABLE 5

|  | % in volume | Weights (g) |
|---|---|---|
| Solvent with dispersant (90 vol. % EEC + 10 vol. % PEG) | 50 | 51.4 |
| SiC | 50 | 117.6 |

The use of this matrix FEC+PEG with respect to the water makes it possible to have a real permittivity of the matrix higher than that of the water (FIG. 1 and FIG. 2). Indeed, the addition of a gelling agent decreases the dielectric properties of the solvent. Thus, a higher permittivity of the solvent used makes it possible to reach higher levels with equal concentrations of dielectric filler. In the solvent alone, for a quantity of PEG dispersant of 10% by volume, the gain in permittivity is of the order of 18% relative to water. When the dielectric charge is added, the gain in permittivity for 40% by volume of charge is of the order of 11%. Thus, using the FEC in place of the water makes it possible to reach identical levels with a smaller amount of dielectric charge. The lifespan of the pads is increased for two main reasons. On the first hand, the melting temperature of the solvent being close to 20° C., the pad is viscous at room temperature, which limits the sedimentation of the particles and ensures good performance in the long term. Indeed, the dielectric properties of such a pad after one month of storage below the melting temperature of the FEC are identical, unlike the BaTiO$_3$-based pads in this case. One the other hand, the evaporation temperature of the solvent being twice that of water, it is much less likely to evaporates. The pad thus retains its initial viscosity as well as its homogeneity on the timescale of 1 year.

Example 4: Permittivity Obtained for Different Materials of the Invention

The table 6 below features the obtained permittivity of different materials according to the present invention.

TABLE 6

| Solvent (vol. %) | Dispersant (vol. %) | Charge (vol. %) | Permittivity (120 MHz) | Permittivity (300 MHz) |
|---|---|---|---|---|
| FEC (87%) | PEG (12%) |  | 65 | 63 |
| Distilled Water (100%) | — |  | 72 | 73 |
| — | PEG (100%) |  | 23 (theoretical) | 22 (theoretical) |
| Charges |  |  |  |  |
| FEC (36%) | PEG (24%) | Carbon black (40%) | 535 | 340 |
| FEC (36%) | PEG (24%) | CaTiO$_3$ (40%) | 74 | 70 |
| FEC (36%) | PEG (24%) | Cu (40%) | 222 | 205 |
| FEC (36%) | PEG (24%) | BaTiO$_3$ (40%) | 145 | 20 |
| FEC (36%) | PEG (24%) | SiC (40%) | 150 | 118 |
| Water (40%) | PEG (20%) | SiC (40%) | 113 | 120 |
| FEC (25%) | PEG (35%) | CaTiO$_3$ (40%) | 54 | 47 |

Since its permittivity is higher than water, an 87% volume content of FEC associated to a 12% volume content of PEG has permittivity level close to distilled water alone. Permittivity levels remain while the matrix is more resilient to particles sedimentation.

This tendency is confirmed when 40% volume content of SIC are mixed with 66 wt. % of solvent and 33 wt. % of dispersant which correspond in the case of FEC and PEG (resp. water and PEG) to 36 vol. % and 24 vol. % (resp. 40 vol. % and 20 vol. %).

A few permittivity levels of different materials mixed with the same volume of solvent (36% of FEC) and dispersant (24% of PEG) are presented to display the achievable permittivity range.

A case with more dispersant (35% of PEG instead of 24%) while keeping the mass ratio of FEC and PEG to 66% is also presented. An excess of dispersant leads to a large permittivity decrease since the dispersant permittivity is as low as 23. Consequently, a trade-off should advantageously to be made between the composite viscosity and performance.

The invention claimed is:

1. A Material for use in a pad for at least one selected from the group consisting of high field and very high field magnetic resonance imaging instruments, wherein the material comprises:
   at least one polar solvent having a melting point in a range of from 14° C. to 50° C.,
   a dispersant, and
   a dielectric charge component,
wherein the dielectric charge component is dispersed in a viscous matrix comprising the at least one polar solvent and the dispersant.

2. The material according to claim 1 wherein the polar solvent is selected from the group consisting of fluoroethylene carbonate, diethyl-cyano-ethyl phosphonate, ethyl-1-methyl-sulfone, tetramethylene sulfone, isopropyl-methyl-sulfone, and combination of two or more thereof.

3. The material according to claim 2, wherein the dispersant is selected from the group consisting of gums, agaroses, gelatins, glycerols, celluloses, polyacrylamides, polysaccharides, polyacrylic polymers, polyethylene glycols, and combinations of two or more thereof.

4. The material according to claim 2, wherein the dielectric charge component is SiC, BaTiO$_3$ or CaTiO$_3$.

5. The material according to claim 2, wherein the dielectric charge component is in a form of particles having average sizes in a range of from 0.1 μm to 50 μm.

6. The material according to claim 1, wherein the dispersant is selected from the group consisting of gums, agaroses, gelatins, glycerols, celluloses, polyacrylamides, polysaccharides, polyacrylic polymers, polyethylene glycols, and combinations of two or more thereof.

7. The material according to claim 6, wherein the dielectric charge component is in a form of particles having average sizes in a range of from 0.1 μm to 50 μm.

8. The material according to claim 1, wherein the dielectric charge component is SiC, $BaTiO_3$ or $CaTiO_3$.

9. The material according to claim 1, wherein the dielectric charge component is in a form of particles having average sizes in a range of from 0.1 μm to 50 μm.

10. The material according to claim 9, wherein the dielectric charge component is in a form of particles having average sizes in a range of from 7 μm to 8 μm.

11. The material according to claim 10, wherein the dielectric charge component is SiC, $BaTiO_3$ or $CaTiO_3$.

12. The material according to claim 1, wherein a proportion of polar solvent is in a range of from 1% to 95% in a total volume of the material.

13. The material according to claim 12, wherein the proportion of polar solvent is in a range of from 10% to 85% in the total volume of the material.

14. The material according to claim 1, wherein the material comprises up to 40% of dispersant in a total volume of the material.

15. The material according to claim 14, wherein a proportion of dispersant is in a range of from 0.5% to 9% in the total volume of the dispersant.

16. The material according to claim 1, wherein a proportion of dielectric charge is in a range of from 4% to 90% in a total volume of the material.

17. The material according to claim 16, wherein the proportion of dielectric charge is in a range of from 10% to 85% in the total volume of the material.

18. The material according to claim 1, wherein a relative permittivity of the solvent is in a range of from 40 to 100.

19. The Pad used in at least one selected from the group consisting of high field and very high field magnetic resonance imaging, comprising the material according to claim 1.

20. The material according to claim 1, wherein a dielectric property of the material is stable over 1 month.

21. The material according to claim 1, wherein a viscosity of the material is stable over 1 year.

\* \* \* \* \*